United States Patent
Yu et al.

(10) Patent No.: US 10,510,698 B2
(45) Date of Patent: Dec. 17, 2019

(54) SEMICONDUCTOR STRUCTURE AND METHOD OF FORMING

(71) Applicant: Taiwan Semiconductor Manufacturing Company, Ltd., Hsinchu (TW)

(72) Inventors: Chen-Hua Yu, Hsinchu (TW); Yu-Hsiang Hu, Hsinchu (TW); Hung-Jui Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/240,890

(22) Filed: Jan. 7, 2019

(65) Prior Publication Data

US 2019/0157228 A1    May 23, 2019

Related U.S. Application Data

(60) Continuation of application No. 16/042,220, filed on Jul. 23, 2018, now Pat. No. 10,177,105, which is a
(Continued)

(51) Int. Cl.
*H01L 23/31* (2006.01)
*H01L 23/29* (2006.01)
(Continued)

(52) U.S. Cl.
CPC ............... *H01L 24/06* (2013.01); *H01L 21/56* (2013.01); *H01L 21/568* (2013.01); *H01L 21/6835* (2013.01); *H01L 23/293* (2013.01); *H01L 23/3128* (2013.01); *H01L 23/3171* (2013.01); *H01L 23/3185* (2013.01); *H01L 23/3192* (2013.01); *H01L 23/528* (2013.01); *H01L 23/5226* (2013.01); *H01L 23/5389* (2013.01); *H01L 24/19* (2013.01); *H01L 24/20* (2013.01); *H01L 24/24* (2013.01); *H01L 24/82* (2013.01); *H01L 25/0655* (2013.01); *H01L 25/50* (2013.01); *H01L 21/486* (2013.01); *H01L 21/4857* (2013.01); *H01L 23/49816* (2013.01); *H01L 2221/68345* (2013.01); *H01L 2221/68359* (2013.01); *H01L 2221/68381* (2013.01);
(Continued)

(58) Field of Classification Search
CPC ........ H01L 25/072; H01L 25/18; H01L 25/50
See application file for complete search history.

(56) References Cited

U.S. PATENT DOCUMENTS 8,361,842 B2    1/2013    Yu et al.
8,680,647 B2    3/2014    Yu et al.
(Continued)

*Primary Examiner* — Daniel P Shook
(74) *Attorney, Agent, or Firm* — Slater Matsil, LLP

(57) ABSTRACT

A device package and methods of forming are provided. The device package includes a logic die and a first passivation layer over the logic die. The device package also includes a memory die and a molding compound extending along sidewalls of the logic die and the memory die. The device package also includes a conductive via extending through the molding compound, and a first redistribution layer (RDL) structure over the molding compound. The molding compound extends between a top surface of the memory die and a bottom surface of the first RDL structure. A top surface of the first passivation layer contacts the bottom surface of the first RDL structure.

20 Claims, 7 Drawing Sheets

Related U.S. Application Data continuation of application No. 15/784,316, filed on Oct. 16, 2017, now Pat. No. 10,032,735, which is a division of application No. 15/205,553, filed on Jul. 8, 2016, now Pat. No. 9,793,230.

(51) Int. Cl.

| | | |
|---|---|---|
| *H01L 23/522* | (2006.01) | |
| *H01L 23/528* | (2006.01) | |
| *H01L 25/065* | (2006.01) | |
| *H01L 25/00* | (2006.01) | |
| *H01L 21/56* | (2006.01) | |
| *H01L 23/00* | (2006.01) | |
| *H01L 21/683* | (2006.01) | |
| *H01L 23/538* | (2006.01) | |
| *H01L 21/48* | (2006.01) | |
| *H01L 23/498* | (2006.01) | |

(52) U.S. Cl.
CPC .............. *H01L 2224/0231* (2013.01); *H01L 2224/02372* (2013.01); *H01L 2224/02373* (2013.01); *H01L 2224/02379* (2013.01); *H01L 2224/0401* (2013.01); *H01L 2224/18* (2013.01); *H01L 2224/19* (2013.01); *H01L 2224/211* (2013.01); *H01L 2224/214* (2013.01); *H01L 2224/244* (2013.01); *H01L 2224/24011* (2013.01); *H01L 2224/24101* (2013.01); *H01L 2224/24137* (2013.01); *H01L 2224/2919* (2013.01); *H01L 2224/32225* (2013.01); *H01L 2224/821* (2013.01); *H01L 2224/82005* (2013.01); *H01L 2224/82031* (2013.01); *H01L 2224/97* (2013.01); *H01L 2924/1431* (2013.01); *H01L 2924/1436* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,318,429 B2 * | 4/2016 | Hu .................. H01L 23/49861 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0287697 A1 | 10/2015 | Tsai et al. |
| 2015/0371951 A1 | 12/2015 | Yeh et al. |

* cited by examiner

US 10,510,698 B2

SEMICONDUCTOR STRUCTURE AND METHOD OF FORMING

PRIORITY CLAIM AND CROSS-REFERENCE

This application is a continuation of U.S. application Ser. No. 16/042,220, filed on Jul. 23, 2018, which is a continuation of U.S. application Ser. No. 15/784,316, filed on Oct. 16, 2017, now U.S. Pat. No. 10,032,735, issued on Jul. 24, 2018, which is a divisional U.S. application Ser. No. 15/205,553, filed on Jul. 8, 2016, now U.S. Pat. No. 9,793,230, issued Oct. 17, 2017, which applications are hereby incorporated herein by reference.

BACKGROUND

In an aspect of conventional packaging technologies, such as fan-out packaging, redistribution layer (RDL) structures may be formed over a die and electrically connected to active devices in a die. Input/output (I/O) pads such as solder balls on under-bump metallurgy (UBMs) may then be formed to electrically connect to the die through the RDL structure. An advantageous feature of this packaging technology is the possibility of forming fan-out packages. Thus, the I/O pads on a die can be redistributed to a greater area than the die, and hence the number of I/O pads packed on the surfaces of the dies can be increased.

Integrated Fan Out (InFO) package technology is becoming increasingly popular, particularly when combined with Wafer Level Packaging (WLP) technology. Such resulting package structures provide for high functional density with relatively low cost and high performance packages. Oftentimes, polymers, such as polyimides, polybenzoxazole (PBO), and the like are used as passivation, insulation, and/or protection layers when forming an RDL structure in an InFO device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
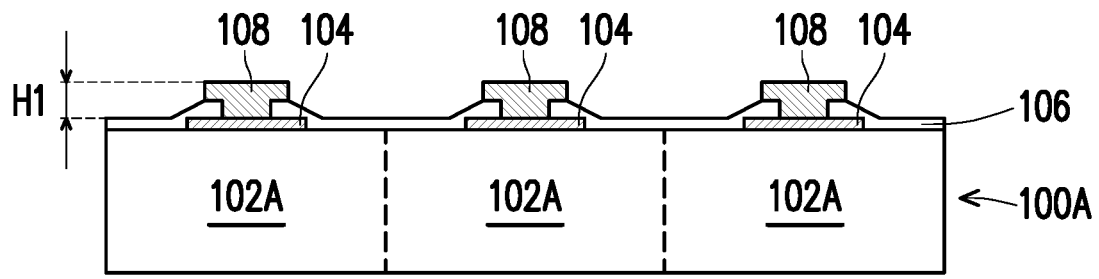
FIGS. 1A, 1B, 2, 3A, 3B, and 4-12 depict cross-sectional views of steps in the manufacture of a device package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, a new structure is disclosed in which a logic die and a high bandwidth memory die are packaged together in a device package in a manner that improves reliability of the high bandwidth memory die and increases yield rates of the device package. For example, multiple dies may be packaged in a single device package. In some embodiments, one or more dies may have a passivation layer over a top surface of the die. The passivation layer may provide advantages to dies undergoing a grinding process to planarize a surface of the die. For example, the passivation layer may provide a "grind stop" layer for a grinding process that is performed over the die and the passivation layer. However, certain materials used for certain passivation layers, such as polybenzoxazole (PBO)-based materials, may need to be cured at high temperatures. On the other hand, certain high bandwidth memory dies, such as dynamic random access memory (DRAM) dies, may be sensitive to high temperatures that may be used to cure the passivation layer. If a passivation layer that is cured at a high temperature is placed over a DRAM memory die and then cured, this may increase the likelihood of a failure of the DRAM memory die, and correspondingly decrease reliability of the DRAM die and decrease yield rates of the device package.

Accordingly, a new structure is provided in which a logic die and a high bandwidth memory die are packaged together in a device package. The logic die includes a passivation layer overlying the logic die that comprises a high temperature curing material. The high bandwidth memory die does not include a passivation layer overlying the high bandwidth memory die that comprises a high temperature curing material. Embodiments described herein are easily integrated into packaging processes, are compatible with wafer level packaging (WLP) applications, and may increase the reliability and yield rates of the high bandwidth memory dies as well as the device packages including the high bandwidth memory dies.

FIGS. 1 through 12 schematically illustrate intermediary steps of manufacturing an integrated fan-out (InFO) package in accordance with various embodiments. Turning to FIG. 1A, a portion of wafer 100A having a plurality of high bandwidth memory dies 102A is shown. High bandwidth memory dies 102A may comprise DRAM, a hybrid memory cube (HMC), a Magnetoresistive random-access memory (MRAM), Flash, Nanoscale Molecular Dynamics (NAMD), a combination of these, or the like. In some embodiments, functional tests (e.g., electrical connection and stress tests) may be performed on wafer 100A, and high bandwidth memory dies 102A may have passed such functional tests. For example, high bandwidth memory dies 102A may be known good dies (KGDs).

Each high bandwidth memory die 102A may be a semiconductor die and may include a substrate, active devices, and an interconnect structure (not shown). The substrate may be a bulk silicon substrate although other semiconductor materials including group III, group IV, and group V elements may also be used. Alternatively, the substrate may be a silicon-on-insulator substrate, a germanium-on-insulator substrate, and the like. Active devices such as transistors may be formed at the top surface of the substrate. An interconnect structure may be formed over the active devices and the substrate.

The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.8 disposed between such conductive features. In some embodiments, the ILD and IMDs may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like. The interconnect structure electrically connects various active devices to form functional circuits within each high bandwidth memory die 102A.

Input/output (I/O) and passivation features may be formed over the interconnect structure. For example, contact pads 104 may be formed over the interconnect structure and may be electrically connected to the active devices through the various conductive features in the interconnect structure. Contact pads 104 may comprise a conductive material such as aluminum, copper, and the like. Furthermore, a passivation layer 106 may be formed over the interconnect structure and the contact pads. Passivation layer 106 may act as an interfacial, insulation, and/or protection layer for the formation of additional package features over high bandwidth memory dies 102A in subsequent process steps. In some embodiments, passivation layer 106 improves adhesion, provides insulation, and/or prevents damage to an underlying interconnect structure in subsequent process steps. In some embodiments, passivation layer 106 may be formed of non-organic materials such as silicon oxide, un-doped silicate glass, silicon oxynitride, and the like. Other suitable passivation materials may also be used. Portions of passivation layer 106 may cover edge portions of the contact pads 104.

Conductive pillars 108 may be disposed over contact pads 104 and passivation layer 106. In some embodiments, conductive pillars 108 comprise copper although other suitable materials (e.g., metals and/or metal alloys) may also be used for conductive pillars 108. Conductive pillars 108 may extend through an opening in passivation layer 106 and electrically connect to contact pad 104. Conductive pillars 108 may have a height H1 of about 5 µm to about 20 µm, for example. Conductive pillars 108 may further extend laterally past edges of passivation layer 106 and cover portions of passivation layer 106.

In some embodiments, conductive pillars 108 may be substantially rectangular in configuration in a plan view. In some embodiments, conductive pillars 108 may be spherical or polygonal in configuration. Conductive pillars 108 may not extend laterally past edges of or cover portions of passivation layer 106. Other configurations of conductive pillars 108 may also be used. For example, conductive pillars 108 may be any type of suitable contact, such as, a contact pad, a top metallization layer, and the like.

The various features of high bandwidth memory dies 102A may be formed by any suitable method and are not described in further detail herein. Furthermore, the general features and configuration of high bandwidth memory dies 102A described above are but one example embodiment, and high bandwidth memory dies 102A may include any combination of any number of the above features as well as other features. For example, each high bandwidth memory die 102A may include multiple contact pads 104 and conductive pillars 108.

Figure 1B:
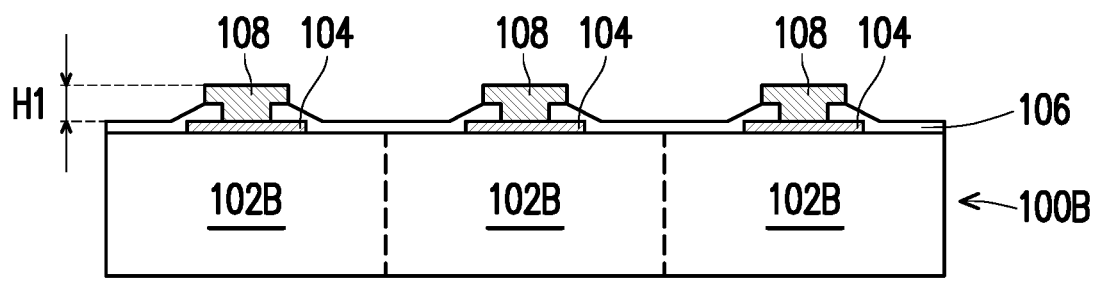

FIG. 1B depicts a portion of wafer 100B having a plurality of logic dies 102B. In some embodiments, functional tests (e.g., electrical connection and stress tests) may be performed on wafer 100B, and logic dies 102B may have passed such functional tests. For example, logic dies 102B may be known good dies (KGDs). The discussion above in connection with FIG. 1A regarding the portion of wafer 100A and high bandwidth memory dies 102A applies to the portion of wafer 100B depicted in FIG. 1B, and will not be reproduced for brevity. Like numbers in FIGS. 1A and 1B depict like elements.

Figure 2:
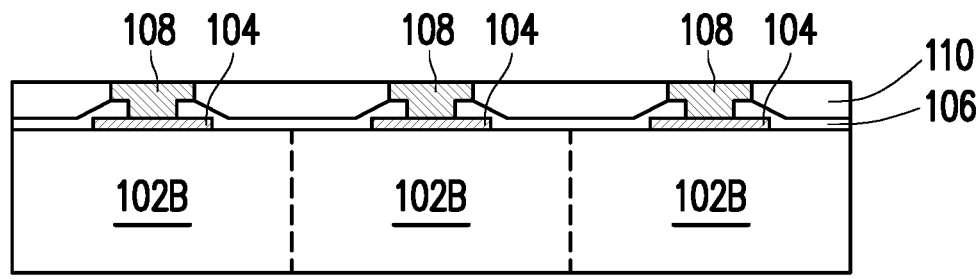

Another passivation layer 110 is formed atop logic dies 102B as illustrated by FIG. 2. Passivation layer 110 leaves at least a portion of conductive pillars 108 exposed. In the illustrated embodiment, passivation layer 110 is a polymer layer comprising, for example, polyimide (PI), PBO, benzocyclobuten (BCB), epoxy, silicone, acrylates, nano-filled pheno resin, siloxane, a fluorinated polymer, polynorbornene, and the like. Alternatively, passivation layer 110 may be a dielectric layer, such as silicon nitride, silicon oxide, silicon oxynitride, and the like. Passivation layer 110 may comprises a different material than a material used to form passivation layer 106. Passivation layer 110 acts as an interfacial, insulation, and/or protection layer for the formation of additional package features over logic dies 102B in subsequent process steps. In some embodiments, passivation layer 110 improves adhesion, provides insulation, and/or prevents damage to underlying passivation layer 106 in subsequent process steps. In some embodiments, passivation layer 110 acts as a "grind stop" layer that indicates a stop point for a grinding process that is performed on a layer that is formed over passivation layer 110.

Passivation layer 110 may be deposited or otherwise formed in a patterned manner to leave conductive pillar 108 at least partially exposed. For example, passivation layer 110 may be deposited using a spin-on coating process. The parameters of the spin-on coating process may be selected so that the deposition of passivation layer 110 leaves conductive pillars 108 exposed. For example, spin-speed, amount of passivation material used, and the like may be controlled so that passivation layer does not cover or extend above top surfaces of conductive pillars 108 after deposition. Alternatively, passivation layer 110 may be formed in a manner that a top surface of passivation layer 110 is higher than a top surface of conductive pillars 108, and a thinning process, e.g. a grinding process, is used to thin passivation layer 110 to expose conductive pillars 108.

After passivation layer 110 is formed over logic dies 102B, passivation layer may undergo a curing process. For example, passivation layer may be heated to a temperature in a range of 180° C. to 390° C. for a time in a range of 30 minutes to 4 hours.

As discussed above, high bandwidth memory dies 102A (shown in FIG. 1A for example) may be sensitive to the high temperatures used to cure passivation layer 110. In some embodiments, a high temperature that increases failure of some high bandwidth memory dies 102 may include temperatures greater than 250° C., although temperatures lower than 250° C. may also increase failure rates of some high bandwidth memory dies 102A. Forming a passivation layer over high bandwidth memory dies 102A that undergoes a curing process and is similar to passivation layer 110 may cause failures in some of the high bandwidth memory dies 102A, decrease reliability of the high bandwidth memory dies 102A, and/or decrease yield rates of the device packages that are formed that include one or more high bandwidth memory dies 102A. As such, a passivation layer that comprises a high temperature curing material and is analogous to passivation layer 110 over logic dies 102B is not formed over high bandwidth memory dies 102A.

Figure 3A:
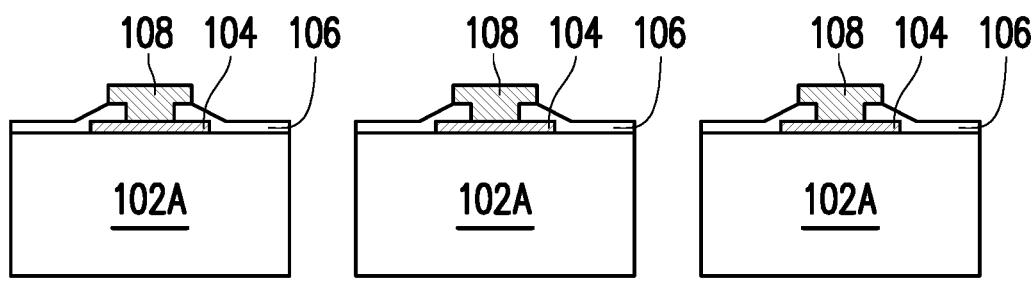

Referring now to FIG. 3A, high bandwidth memory dies 102A may be separated in accordance with some embodiments. For example, wafer 100A may be thinned to a desired thickness, for example, by performing a mechanical grinding, a chemical mechanical polish (CMP), an etching process, and the like on a backside of high bandwidth memory dies 102A. An adhesive layer (not shown) (e.g., a die attach film (DAF), and the like) may be disposed on a backside of wafer 100A. Subsequently, high bandwidth memory dies 102A may be singulated. For example, a die saw may be performed along scribe lines disposed between high bandwidth memory dies 102A to separate each high bandwidth memory die 102A from wafer 100A.

Figure 3B:
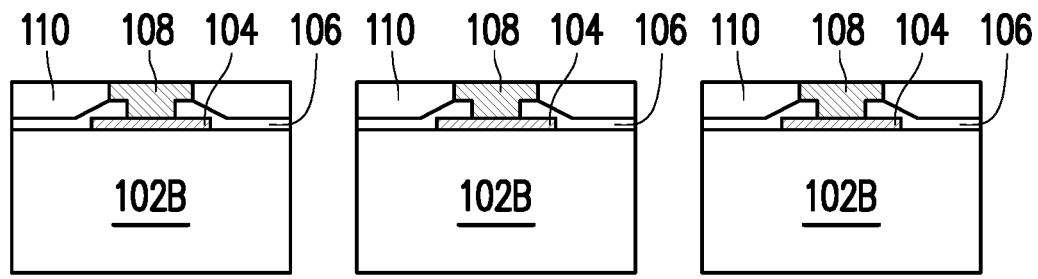

Referring to FIG. 3B, logic dies 102B may also be separated in accordance with some embodiments. After passivation layer 110 is formed, wafer 100B may be thinned to a desired thickness, for example, by performing a mechanical grinding, a chemical mechanical polish (CMP), an etching process, and the like on a backside of logic dies 102B. An adhesive layer (e.g., a die attach film (DAF), and the like, not shown) may be disposed on a backside of wafer 100B. An adhesive layer (not shown) may be formed on a side of logic dies 102B opposite passivation layer 110. Subsequently, logic dies 102B may be singulated. For example, a die saw may be performed along scribe lines disposed between logic dies 102B to separate each logic die 102B from wafer 100.

Figure 4:
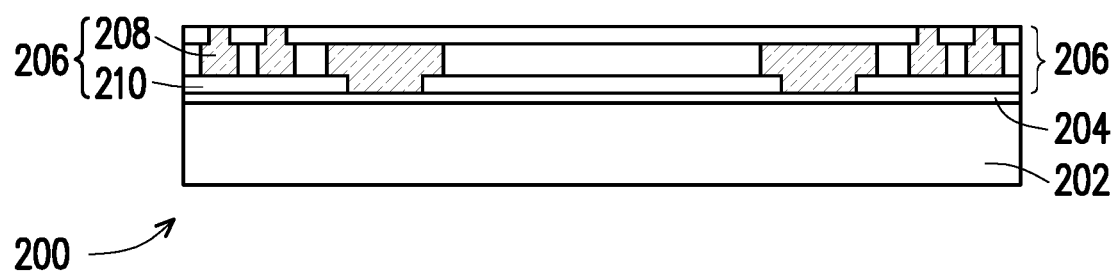
Figure 5:
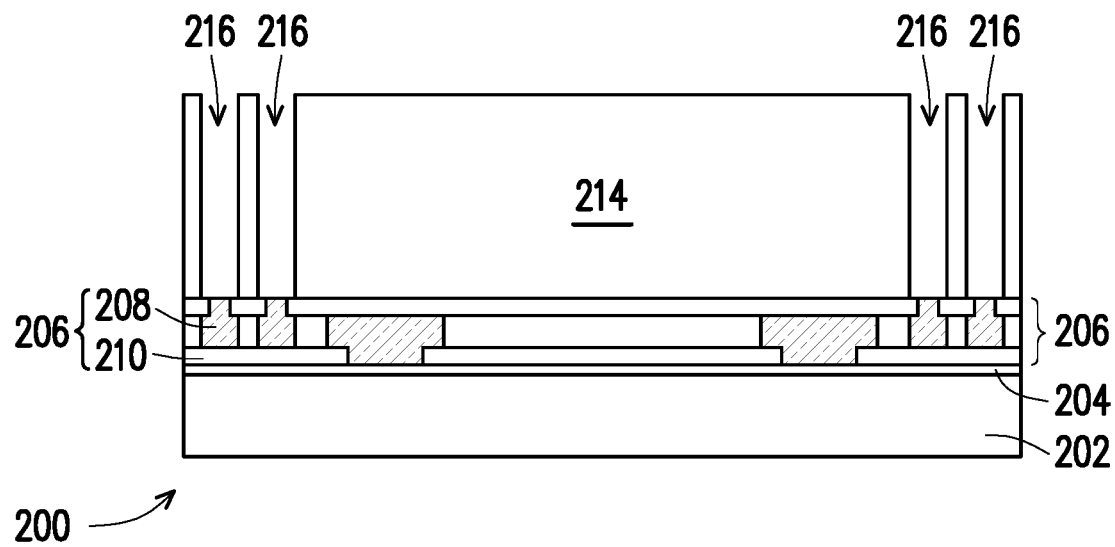
Figure 6:
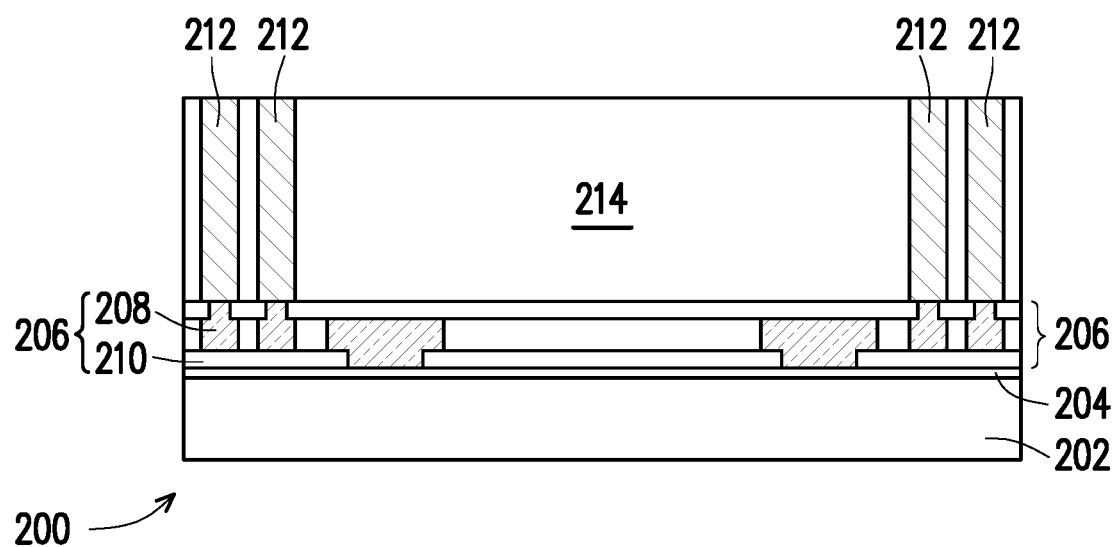

FIGS. 4 through 6 illustrate various intermediary steps of forming various features of device package 200 prior to the mounting of a high bandwidth memory die 102A and logic die 102B. Subsequently, in FIG. 7, high bandwidth memory die 102A and logic die 102B may be integrated with package 200. In FIG. 4, a carrier 202 is provided. Carrier 202 may comprise glass, ceramic, or other suitable material, and carrier 202 provides structural support during the formation of various features in device package 200. A temporary adhesive layer 204 (e.g., a glue layer, a light-to-heat conversion (LTHC) coating, an ultraviolet (UV) film, and the like) is disposed over carrier 202.

Subsequently, backside RDL structure 206 may be formed over adhesive layer 204 and carrier 202. RDL structure 206 may include conductive features 208 (e.g, conductive lines and/or vias) formed in one or more polymer layers 210. Polymer layers 210 may be formed of any suitable material (e.g., PI, PBO, BCB, epoxy, silicone, acrylates, nano-filled pheno resin, siloxane, a fluorinated polymer, polynorbornene, and the like) using any suitable method, such as, a spin-on coating technique, sputtering, and the like.

Conductive features 208 may be formed in polymer layers 210. The formation of such conductive features may include patterning polymer layers 210 (e.g., using a combination of photolithography and etching processes) and forming the conductive features 208 in patterned polymer layers 210 (e.g., by depositing a seed layer and using a mask layer to define the shape of conductive features 208). Conductive features 208 may be designed to form functional circuits and input/output features for subsequently attached dies (e.g., dies 102).

Next, as illustrated by FIG. 5, a patterned photoresist 214 may be formed over backside RDL structure 206 and carrier 202. For example, photoresist 214 may be deposited as a blanket layer over backside RDL structure 206. Next, portions of photoresist 214 may be exposed using a photo mask (not shown). Exposed or unexposed portions of photoresist 214 are then removed depending on whether a negative or positive resist is used. The resulting patterned photoresist 214 may include openings 216, which may be disposed at peripheral areas of carrier 202. Openings 216 may further expose conductive features 208 in backside RDL structure 206.

FIG. 6 illustrates the filling of openings 216 with a conductive material such as copper, silver, gold, and the like to form conductive vias 212. The filling of openings 216 may include first depositing a seed layer (not shown) and plating openings 216 (e.g., electro-chemically plating, electroless plating, and the like) with a conductive material. The conductive material may overfill openings 216, and a CMP may be performed to remove excess portions of the conductive material over photoresist 214.

Figure 7:
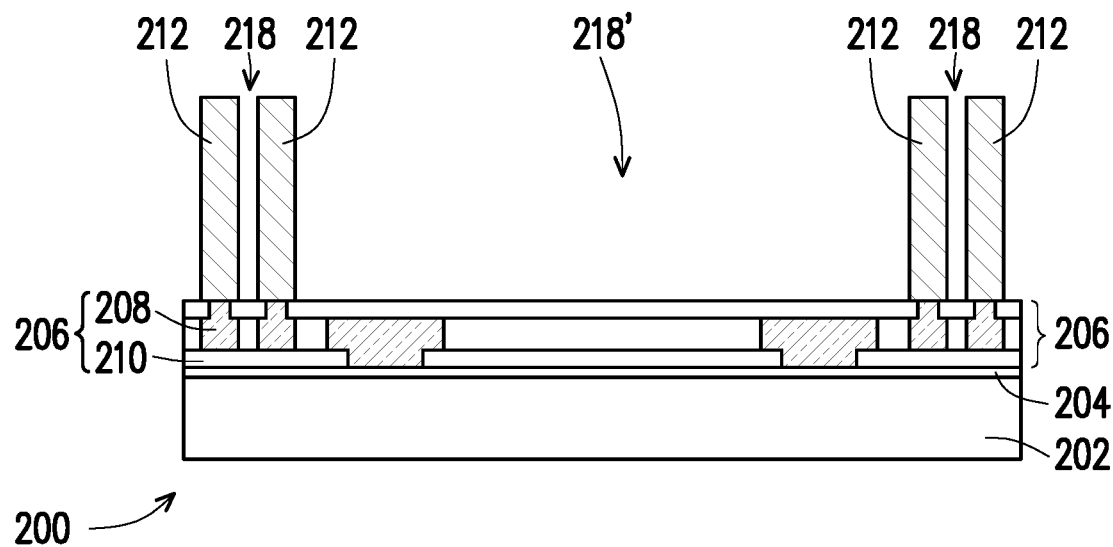

Next, as illustrated by FIG. 7, photoresist 214 is removed. A plasma ashing or wet strip process may be used to remove photoresist 214. Optionally, the plasma ashing process may be followed by a wet dip in a sulfuric acid ($H_2SO_4$) solution to clean package 200 and remove remaining photoresist material.

Thus, conductive vias 212 are formed over backside RDL structure 206. Alternatively, conductive vias 212 may be replaced with conductive studs or conductive wires (e.g., copper, gold, or silver wire). Conductive vias 212 may be spaced apart from each other by openings 218. At least one opening 218' between adjacent conductive vias 212 may be large enough to dispose one or more semiconductor dies (e.g., dies 102A and 102B) therein.

Figure 8:
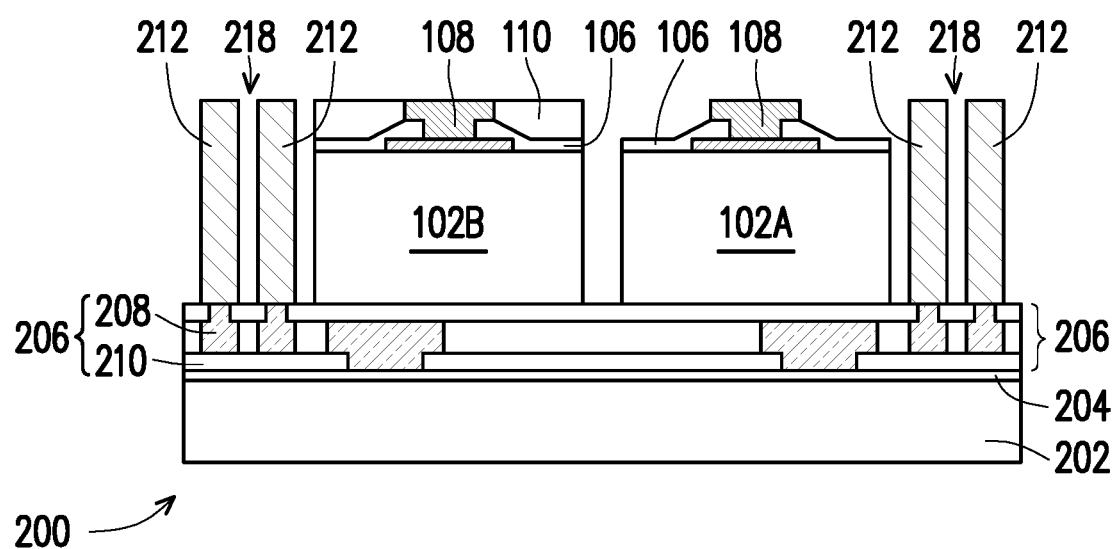

Next, as illustrated in FIG. 8, one or more high bandwidth memory dies 102A and one or more logic dies 102B (e.g., as formed in FIGS. 1 through 5) are mounted to a device package 200. Device package 200 may include a carrier 202, and one or more interconnect layers (e.g., backside RDL structure 206 having conductive features 208) as shown. Other interconnect structures such as conductive vias 212 electrically connected to conductive features 208 in backside RDL structure 206 may also be included. An adhesive layer (not shown) may be used to affix dies 102A and 102B to backside RDL structure 206. In the illustrated embodiment, one high bandwidth memory die 102A and one logic die 102B is mounted to device package 200, although a configuration in which more than two dies is mounted is also contemplated.

FIG. 8 depicts an embodiment in which high bandwidth memory die 102A and logic die 102B are mounted side by side, with conductive vias 212 positioned on outer edges of device package 200. The positioning of the elements depicted in FIG. 8 is exemplary, and other placements of high bandwidth memory die 102A, logic die 102B, and conductive vias 212 is contemplated. FIG. 8 also depicts an embodiment in which top surfaces of a conductive pillar 108 over high bandwidth memory die 102A and a conductive pillar 108 over logic die 102B are substantially planar. In some embodiments, conductive pillar 108 over high bandwidth memory die 102A and conductive pillar 108 logic die 102B may not be planar.

Figure 9:
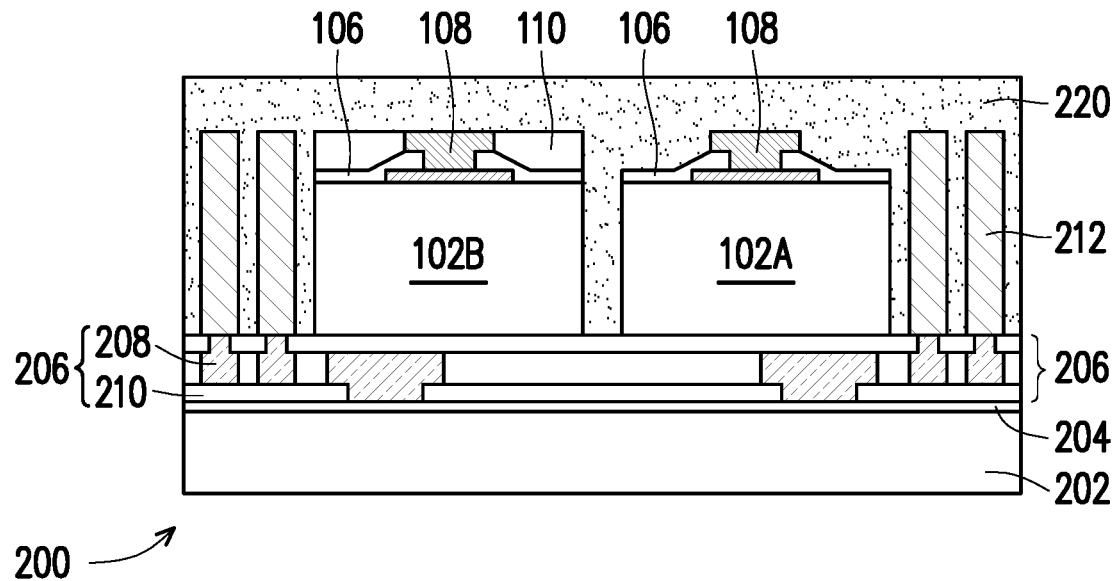

Referring next to FIG. 9, a molding compound 220 may be formed over package 200 after high bandwidth memory dies 102A and logic die 102B are mounted to backside RDL structure 206 in opening 218'. Molding compound 220 is dispensed to fill gaps between high bandwidth memory die 102A, logic die 102B, and conductive vias 212. Molding compound 220 extends over passivation layer 110 on logic dies 102B. Because high bandwidth memory dies 102A does not include passivation layer 110, the molding material may extend directly over passivation layer 106 and along sidewalls of conductive pillar 108 on high bandwidth memory die 102A.

Molding compound 220 may include any suitable material such as an epoxy resin, a molding underfill, and the like. Suitable methods for forming molding compound 220 may include compressive molding, transfer molding, liquid encapsulent molding, and the like. For example, molding compound 220 may be dispensed between dies 102/conductive vias 212 in liquid form. Subsequently, a curing process is performed to solidify molding compound 220. The filling of molding compound 220 may overflow high bandwidth memory die 102A, logic die 102B and conductive vias 212 so that molding compound 220 covers top surfaces of high bandwidth memory die 102A, logic die 102B an conductive vias 212.

Figure 10:
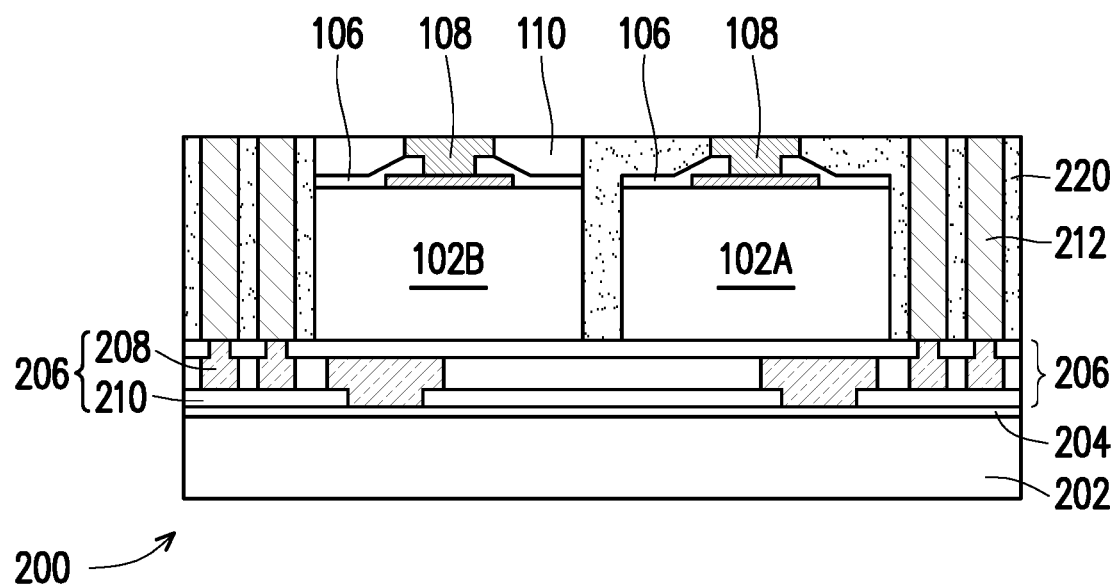

In the process step illustrated in FIG. 10, molding compound 220 is planarized (e.g., using CMP, grinding, or the like) to reduce its overall thickness and thus expose conductive vias 212 and conductive pillars 108. In some embodiments, a grinding process may terminate upon detection of passivation layer 110. As such, passivation layer 110 may act as a "grind stop" layer. Because the resulting structure includes conductive vias 212 that extend through molding compound 220, conductive vias 212 may also be referred to as through molding vias, through intervias (TIVs), and the like. Conductive vias 212 provide electrical connections to conductive features 208 in backside RDL structure 206 in package 200.

In the embodiment illustrated by FIG. 10, a top surface of conductive pillar 108 over logic die 102B is substantially planar with a top surface of passivation layer 110. In turn, the top surface of passivation layer 110 is substantially planar with a top surface of molding compound 220. A top surface of conductive pillar 108 over high bandwidth memory die 102A is also substantially planar with a top surface of molding compound 220, and molding compound 220 extends over passivation layer 106.

Figure 11:
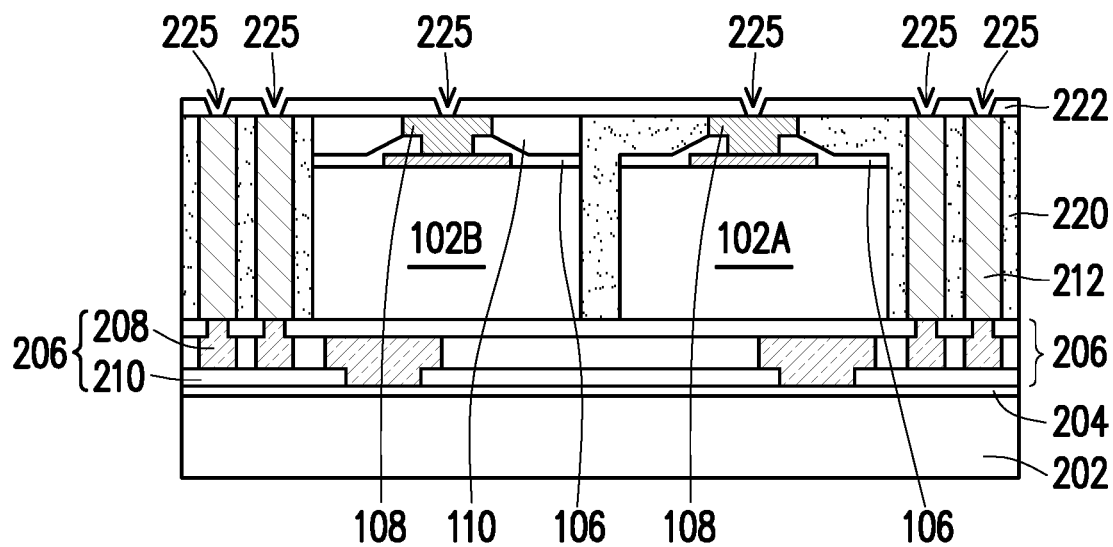
Figure 12:
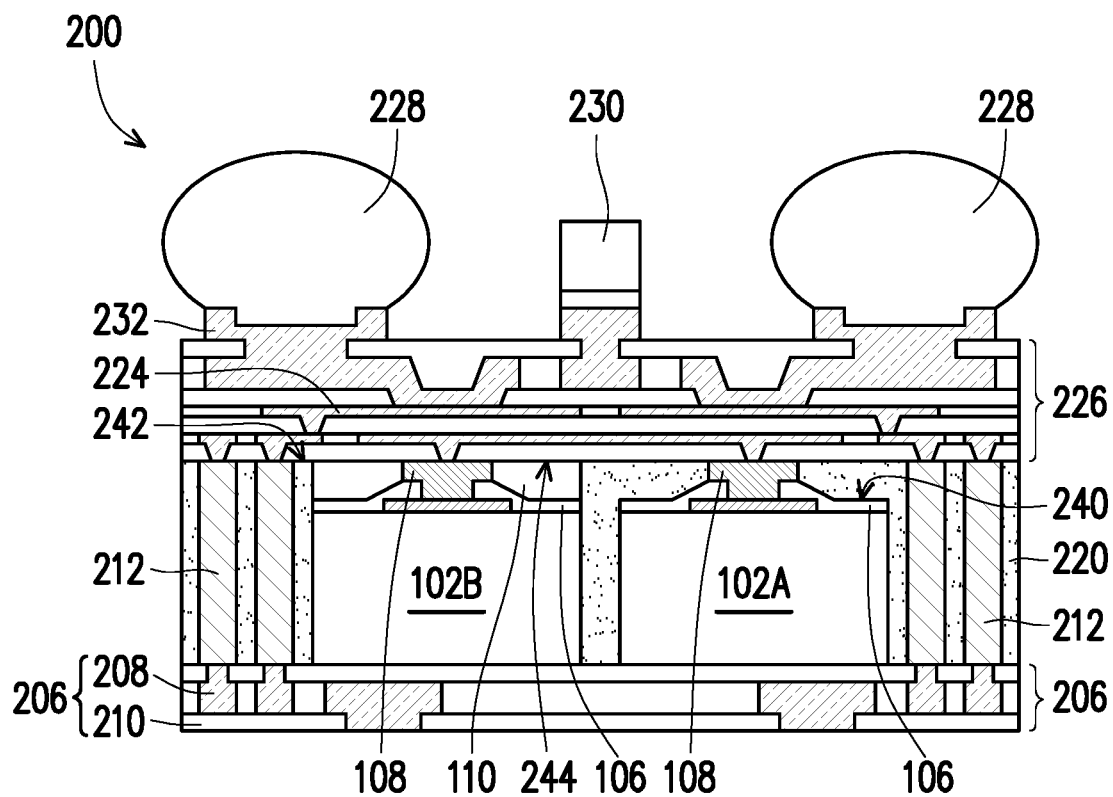

FIGS. 11 and 12 illustrate process steps of forming RDL structure 226 (see FIG. 12) having conductive features 224 (e.g., vias and/or contacts) electrically connected to conductive pillars 108. FIG. 11 illustrates the formation of a patterned polymer layer 222 having openings 225. Polymer layer 222 may comprise PI, PBO, BCB, epoxy, silicone, acrylates, nano-filled pheno resin, siloxane, a fluorinated polymer, polynorbornene, and the like, for example. In some embodiments, polymer layer 222 may comprise a same material as passivation layer 110, or other suitable materials could be employed for layer 222.

Polymer layer 222 may be formed using a blanket deposition process (e.g., spin-on coating, sputtering, and the like) over molding compound 220 and conductive pillars 108. After deposition, polymer layer 222 may be patterned to include openings 225 using photolithography and/or etching processes, for example. Openings 225 may expose conductive pillars 108 and conductive vias.

Subsequently, openings 225 may be filled with a conductive material. For example, a seed layer (not shown) may be formed in openings 225 and a conductive material may be plated in openings 225 using an electrochemical plating process, electroless plating process, and the like. The resulting vias (see FIG. 12) in polymer layer 222 may be electrically connected to conductive pillars 108 and/or conductive vias 212.

Additional polymer layers having conductive features may be formed over polymer layer 222. For example, FIG. 12 illustrates RDL structure 226 having conductive features 224 formed therein. RDL structure 226 may be substantially similar to backside RDL structure 206 both in composition and formation process. For example, RDL structure 226 may include conductive features 224 (e.g., conductive lines and vias) disposed between various polymer layers. Conductive features 224 are electrically connected to high bandwidth memory die 102A and logic die 102B through conductive pillars 108. Additional detailed description of RDL structure 226 is omitted for brevity.

As can be seen from FIG. 12, in some embodiments molding material 220 may extend between the bottom surface 242 of RDL structure 226 and the top surface 240 of high bandwidth memory dies 102A. In some embodiments, the top surface 244 of passivation layer 110 may contact the bottom surface 242 of RDL structure 226 such that molding compound 220 is not disposed between the top surface 244 of passivation layer 110 and the bottom surface 242 of RDL structure 226.

Additional package features, such as external connectors 228 and other surface mount devices (SMDs) 230 may be disposed over RDL structure 226. Connectors 228 may be ball grid array (BGA) balls, controlled collapse chip connector (C4) bumps, and the like disposed on under metal metallurgies (UBMs) 232, which may be formed over RDL structure 226. Connectors 228 and SMDs 230 may be electrically connected to one or more dies 102 by way of RDL structure 226. Connectors 228 may be used to electrically connect package 200 to other package components such as another device die, interposers, package substrates, printed circuit boards, a mother board, and the like.

As further illustrated by FIG. 12, package 200 may be removed from carrier 202 by removing temporary adhesive layer 204. The removal process of adhesive layer 204 may include applying heat to a LTHC layer, exposing an UV tape to UV light, and the like. The removal of carrier 202 may expose additional input/output contacts in package 200. For example, conductive features in backside RDL structure 206 (e.g., contact pads 208') may also be used to electrically connect package 200 other package components such as memory dies or any other the package component.

Accordingly, a new structure is provided in which a logic die and a high bandwidth memory die are packaged together in a device package in a manner that may improve reliability of the high bandwidth memory die and yield rates of the device package. As described in detail above, a high bandwidth memory die and a logic die are packaged together in a device package. A passivation layer is formed over the logic die, and provides protection to the logic die as well as functioning as a "grind stop" layer for a grinding process that is performed on a molding material that is formed over the passivation layer. The passivation layer may include a high temperature curing material, such as a polybenzoxazole (PBO) based material. The high bandwidth memory die included in the device package may be sensitive to the high temperatures necessary to cure the passivation layer. For example, if a passivation layer that is cured at a high a temperature is placed over a DRAM memory die and then cured, this may increase the likelihood of a failure of the DRAM memory die, and correspondingly decrease reliability of the DRAM die. As such, the high bandwidth memory die does not include a high temperature curing passivation layer over the high bandwidth memory device. Instead, a molding compound is formed directly over the high bandwidth memory die. Accordingly, a new structure is provided in which a logic die and a high bandwidth memory die are packaged together in a device package in a manner that increases reliability of the device package and increases yield rates of the device packages.

In accordance with an embodiment, a device package includes a logic die. A first passivation layer is over the logic die. The device package also includes a memory die. A molding compound extends along sidewalls of the logic die and the memory die. A conductive via extends through the molding compound. A first redistribution layer (RDL) structure is over the molding compound. The molding compound extends between a top surface of the memory die and a bottom surface of the first RDL structure. A top surface of the first passivation layer contacts the bottom surface of the first RDL structure.

In accordance with another embodiment, method includes providing a logic die and a memory die. The method also includes forming a first conductive pillar over the logic die and a second conductive pillar over the memory die. The method also includes forming a first passivation layer over the logic die. The method also includes forming a molding compound extending along sidewalls of the logic die and the memory die. The method also includes thinning the molding compound so that an upper surface of the molding compound is substantially planar with an upper surface of the first passivation layer. A portion of the molding compound is disposed over the memory die after thinning. The method also includes forming a redistribution layer (RDL) structure over the molding compound. The upper surface of the first passivation layer contacts a bottom surface of the RDL structure.

In accordance with yet another embodiment, a method includes receiving a first die, a first passivation layer and a first conductive pillar being disposed over the first die. The method also includes receiving a second die, a second conductive pillar being disposed over the second die. The method also includes forming a first redistribution layer (RDL) structure. The method also includes forming a molding compound extending along sidewalls of the first die and the second die. The method also includes thinning the molding compound to expose the first passivation layer, the first conductive pillar the second conductive pillar, and a plurality of conductive vias. The method also includes forming a second redistribution layer structure over the molding compound. Molding compound extends between a bottom surface of the second RDL structure and a top surface of the second die. The first passivation layer contacts the bottom surface of the second RDL structure.

A device package is provided in accordance with some embodiments. The device package includes a logic die and a first passivation layer over the logic die. The device package also includes a memory die and a molding compound extending along sidewalls of the logic die and the memory die. The device package also includes a conductive via extending through the molding compound. The device package also includes a first redistribution layer (RDL) structure over the molding compound, where the molding compound extends between a top surface of the memory die and a bottom surface of the first RDL structure along a line that intersects the memory die and that is parallel to a sidewall of the memory die, and where a top surface of the first passivation layer contacts the bottom surface of the first RDL structure. In an embodiment the memory die is a dynamic random access memory (DRAM) die. In an embodiment the first passivation layer comprises polybenzoxazole (PBO). In an embodiment a second passivation layer is disposed along a surface of the memory die, the surface of the second passivation layer contacting the molding compound. In an embodiment the first passivation layer includes a first material, the second passivation layer includes a second material, and the first material and the second material are different. In an embodiment a surface mount device (SMD) is disposed over the first RDL structure. In an embodiment a conductive pillar is disposed over the memory die, where a top surface of the conductive pillar contacts the bottom surface of the first RDL structure, and where the molding compound extends along sidewalls of the conductive pillar. In an embodiment the device package always includes a second RDL structure underlying the molding compound, where the conductive via extends from the first RDL structure to the second RDL structure.

A package is provided in accordance with some embodiments. The package includes a first die including a first contact. The package also includes a second die including a second contact. The package also includes a first insulating layer over the first die, the first contact extending through the first insulating layer. The package also includes a molding compound extending along sidewalls of the first die and the second die, where a portion of a surface of the molding compound is level with a surface of the first insulating layer that is farthest from the first die. The package also includes a dielectric layer overlying the first die and the second die, one or more conductors extending in the dielectric layer, where the first contact and the second contact are respectively electrically connected to the one or more conductors, and where the portion of the surface of the molding compound contacts a portion of a surface of the dielectric layer, the portion of the surface of the dielectric layer being laterally positioned between a first sidewall of the second die and a second sidewall of the second die, the first sidewall being opposite to the second sidewall. In an embodiment the first insulating layer contacts the surface of the dielectric layer. In an embodiment the molding compound contacts sidewalls of the first insulating layer. In an embodiment the first insulating layer overlies a second insulating layer that extends along a surface of the first die. In an embodiment the molding compound extends along sidewalls of the second contact. In an embodiment a plurality of through vias extend through the molding compound. In an embodiment the first die is a logic die and the second die is a memory die.

A package is provided in accordance with some embodiments. The package includes a first redistribution structure comprising one or more first dielectric layers, one or more first conductors extending through the one or more first dielectric layers. The package includes a logic die over the first redistribution structure. The package includes a memory die over the first redistribution structure, the memory die positioned beside the logic die. The package includes a passivation layer over the logic die. The package includes a molding material extending between the logic die and the memory die along a shortest line between the logic die and the memory die. The package includes a second redistribution structure comprising one or more second dielectric layers, one or more second conductors extending through the one or more second dielectric layers, the passivation layer contacting the second redistribution structure. The package also includes one or more connectors over the second redistribution structure, the molding material extending between a surface of the memory die that is closest to the second redistribution structure and a surface of the one or more connectors that is closest to the memory die. In an embodiment a through via electrically connects the one or more first conductors to the one or more second conductors. In an embodiment a first contact extends through the passivation layer between the logic die and the second redistribution structure. In embodiment a second contact extends through the molding material between the memory die and the second redistribution structure. In an embodiment the package also includes a surface mounted device connected to the second redistribution structure.

A device is provided in accordance with some embodiments. The device includes a first die, a first passivation layer overlying the first die, a second die adjacent the first die, a plurality of redistribution layers overlying the first die and the second die, a molding material extending along sidewalls of the first die and sidewalls of the second die, and a plurality of through vias extending through the molding material. In an embodiment, each redistribution layer of the plurality of redistribution layers includes one or more connectors extending through a corresponding dielectric layer, a first redistribution layer of the plurality of redistribution layers is closest to the first die and the second die, and the first passivation layer contacts a first dielectric layer of the first redistribution layer. In an embodiment, a first surface of the second die is closest to the first redistribution layer, a first surface of the first redistribution layer is closest to the second die, and the molding material extends between the first surface of the second die and the first surface of the first redistribution layer.

A package is provided in accordance with some embodiments. The package includes a first die including a first electrical connector, a second die adjacent the first die, the second die including a second electrical connector, molding material extending along sidewalls of the first die and sidewalls of the second die, a conductive via extending through the molding material, and a first redistribution structure over the first die and the second die. In an embodiment, the molding material contacts sidewalls of the first electrical connector or sidewalls of the second electrical connector. In an embodiment, the first redistribution structure is electrically coupled to the conductive via, the first electrical connector and the second electrical connector.

A package is provided in accordance with some embodiments. The package includes a first die disposed over an insulating layer, the first die comprising a first contact extending through a first passivation layer, a second die disposed over the insulating layer adjacent the first die, the second die comprising a second contact extending through a second passivation layer, a third passivation layer overlying the first die, a molding material extending between the first die and the second die, and a redistribution structure overlying the first die and the second die. In an embodiment, a first surface of the second passivation layer comprises a flat region and an angled region, the flat region extends in a first direction that is parallel to a major surface of the second die, and the angled region extends in a second direction different from the first direction. In an embodiment, the molding material contacts the first surface of the second passivation layer in the angled region and in the flat region. In an embodiment, the third passivation layer contacts a dielectric layer of the redistribution structure. In an embodiment, the first surface of the second passivation layer faces the redistribution structure.

A package is provided in accordance with some embodiments. The package includes a first die, a first passivation layer overlying the first die, a second die adjacent the first die, and a first insulating layer overlying the first die and the second die. The first passivation layer is in physical contact with the first insulating layer. The package further includes a molding material extending along sidewalls of the first die, sidewalls of the second die and sidewalls of the first passivation layer. The molding material extends between the second die and the first insulating layer.

A package is provided in accordance with some embodiments. The package includes a first die including a first electrical connector, a second die adjacent the first die, the second die including a second electrical connector, and a molding material extending along sidewalls of the first die and sidewalls of the second die. The molding material is in physical contact with sidewalls of the second electrical connector. Sidewalls of the first electrical connector are separated from the molding material. The package further includes a first insulating layer over the first die and the second die. The first insulating layer is in physical contact with the first electrical connector, the second electrical connector and the molding material.

A package is provided in accordance with some embodiments. The package includes a first die comprising a first contact extending through a first passivation layer, a second die comprising a second contact extending through a second passivation layer, a third passivation layer overlying the first passivation layer and surrounding the first contact, and a molding material extending between the first die and the second die. The molding material is in physical contact with sidewalls of the first passivation layer, sidewalls of the second passivation layer, and sidewalls of the third passivation layer. The package further includes a first insulating layer overlying the first die and the second die. The third passivation layer is in physical contact with the first insulating layer. The second passivation layer is separated from the first insulating layer by the molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first die;
a first passivation layer overlying the first die;
a second die adjacent the first die;
a first insulating layer overlying the first die and the second die, wherein the first passivation layer is in physical contact with the first insulating layer; and
a molding material extending along sidewalls of the first die, sidewalls of the second die and sidewalls of the first passivation layer, wherein the molding material extends between the second die and the first insulating layer.

2. The package of claim 1, further comprising a plurality of conductive columns extending through the molding material.

3. The package of claim 1, wherein the first passivation layer and the first insulating layer comprise a same polymer material.

4. The package of claim 1, further comprising:
a second passivation layer overlying the first die, wherein the first passivation layer is interposed between the second passivation layer and the first insulating layer; and
a third passivation layer overlying the second die, wherein the molding material extends between the third passivation layer and the first insulating layer.

5. The package of claim 4, wherein the second passivation layer and the third passivation layer comprise a same material.

6. The package of claim 4, wherein the first passivation layer and second passivation layer comprise different materials.

7. The package of claim 1, wherein a surface of the first passivation layer is level with a surface of the molding material.

8. A package comprising:
a first die comprising a first electrical connector;
a second die adjacent the first die, the second die comprising a second electrical connector;
a molding material extending along sidewalls of the first die and sidewalls of the second die, wherein the molding material is in physical contact with sidewalls of the second electrical connector, and wherein sidewalls of the first electrical connector are separated from the molding material; and
a first insulating layer over the first die and the second die, the first insulating layer being in physical contact with the first electrical connector, the second electrical connector and the molding material.

9. The package of claim 8, further comprising a first conductive column and a second conductive column extending through the molding material, wherein the first die and the second die are interposed between the first conductive column and the second conductive column.

10. The package of claim 8, further comprising:
a first passivation layer surrounding the first electrical connector; and
a second passivation layer over the first passivation layer, wherein the first electrical connector extends through the second passivation layer, wherein the second passivation layer is in physical contact with the first insulating layer, and wherein the first passivation layer and the second passivation layer comprise different materials.

11. The package of claim 10, further comprising a third passivation layer surrounding the second electrical connector, wherein the first passivation layer and the third passivation layer comprise a same material.

12. The package of claim 10, wherein the second passivation layer and the first insulating layer comprises a same material.

13. The package of claim 10, wherein the molding material is physical contact with sidewalls of the first passivation layer and sidewalls of the second passivation layer.

14. The package of claim 8, further comprising a conductive layer over the first insulating layer, a first portion of the conductive layer extending through the first insulating layer and physically contacting the first electrical connector, a second portion of the conductive layer extending through the first insulating layer and physically contacting the second electrical connector.

15. A package comprising:
a first die comprising a first contact extending through a first passivation layer;
a second die comprising a second contact extending through a second passivation layer;
a third passivation layer overlying the first passivation layer and surrounding the first contact;
a molding material extending between the first die and the second die, wherein the molding material is in physical contact with sidewalls of the first passivation layer, sidewalls of the second passivation layer, and sidewalls of the third passivation layer; and
a first insulating layer overlying the first die and the second die, wherein the third passivation layer is in physical contact with the first insulating layer, and wherein the second passivation layer is separated from the first insulating layer by the molding material.

16. The package of claim 15, wherein the molding material contacts a sidewall of the second contact.

17. The package of claim 15, further comprising a conductive column extending through the molding material.

18. The package of claim 17, wherein a first surface of the conductive column is level with a surface of the first die, wherein a second surface of the conductive column is level with a surface of the third passivation layer, and wherein the first surface of the conductive column is opposite the second surface of the conductive column.

19. The package of claim 15, wherein the first passivation layer and the second passivation layer comprise a first material, and wherein the third passivation layer comprises a second material different from the first material.

20. The package of claim 19, wherein the first insulating layer comprises the second material.

* * * * *